United States Patent
Balasinski et al.

[11] Patent Number: 5,640,023
[45] Date of Patent: Jun. 17, 1997

[54] SPACER-TYPE THIN-FILM POLYSILICON TRANSISTOR FOR LOW-POWER MEMORY DEVICES

[75] Inventors: Artur P. Balasinski, Dallas; Kuei-Wu Huang, Irving, both of Tex.

[73] Assignee: SGS-Thomson Microelectronics, Inc., Carrollton, Tex.

[21] Appl. No.: 521,709

[22] Filed: Aug. 31, 1995

[51] Int. Cl.⁶ .................... H01L 29/76; H01L 31/036; H01L 31/42
[52] U.S. Cl. .................. 257/66; 257/67; 257/69; 257/213; 257/217
[58] Field of Search ................ 257/66, 67, 69, 257/93, 151, 213, 217, 239

[56] References Cited

U.S. PATENT DOCUMENTS 4,554,572  11/1985  Chatterjee .................. 257/69

Primary Examiner—Carl Whitehead, Jr.
Attorney, Agent, or Firm—Theodore E. Galanthay; Lisa K. Jorgenson; Renee M. Larson

[57] ABSTRACT

The cross-sectional area of a thin-film transistor (TFT) is decreased in order to minimize bitline to supply leakage of the TFT. This is accomplished by utilizing a spacer etch process to manufacture a TFT having a very narrow and thin channel in a controllable manner. The spacer dimensions of the TFT may be adjusted by simply modifying the thicknesses of the poly gate and the channel poly. The channel thickness is limited by the thickness of the deposited channel polysilicon which may be as thin as approximately 300 Å to 500 Å, and the channel width of the TFT corresponds to the height of the spacer etched along the polysilicon gate of the device which may be as small as approximately 0.15 to 0.25 μm.

6 Claims, 5 Drawing Sheets

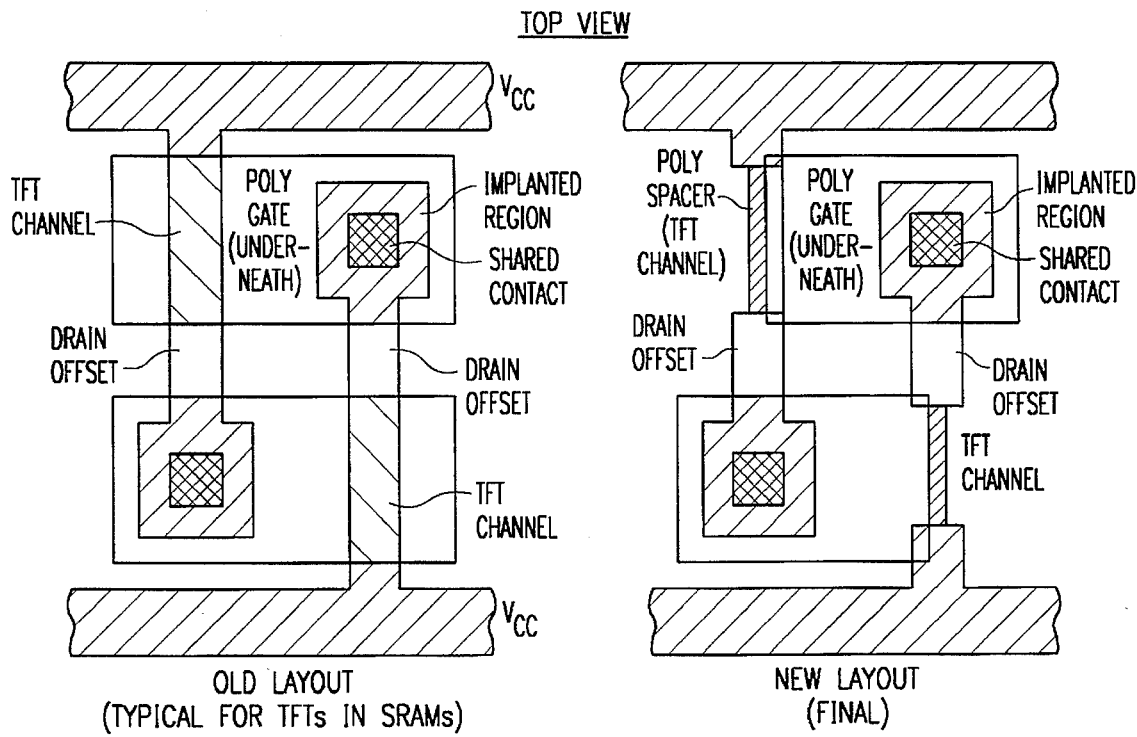
FIG. 9 OLD LAYOUT (TYPICAL FOR TFTs IN SRAMs)
FIG. 10 NEW LAYOUT (FINAL)
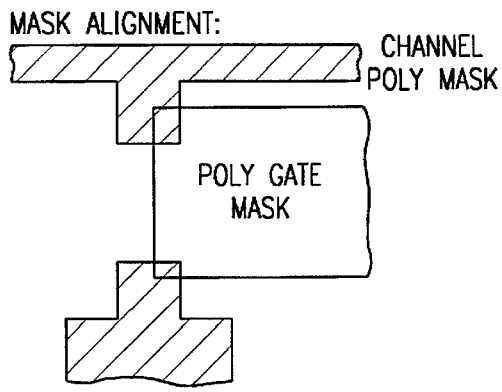
FIG. 11
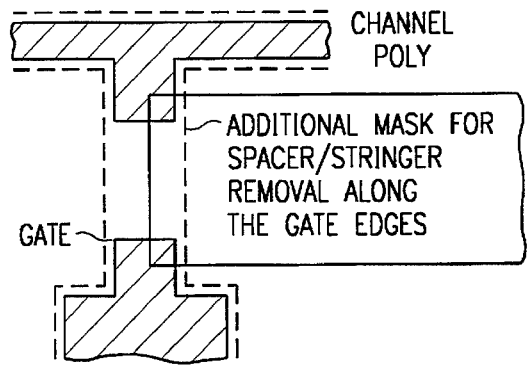
FIG. 12
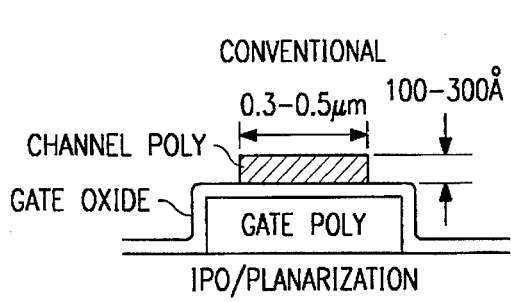
FIG. 13 (PRIOR ART)
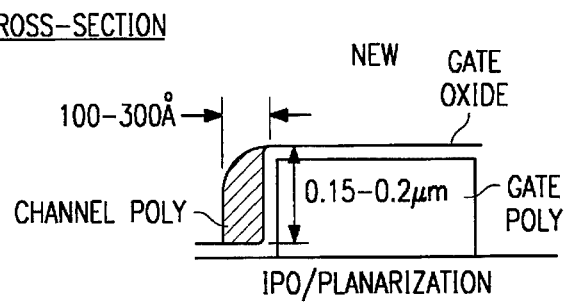
FIG. 14

SPACER-TYPE THIN-FILM POLYSILICON TRANSISTOR FOR LOW-POWER MEMORY DEVICES

BACKGROUND OF THE INVENTION

The present invention relates generally to integrated circuit memory devices, and more specifically to integrated circuit memory devices which employ thin-film transistor (TFT) technology.

Thin-film transistors (TFTs) are becoming the load devices of choice in many integrated circuit memory devices, particularly in static random access memory (SRAM) cells. TFTs are superior to standard polysilicon resistor load devices, in that TFTs have an inherently lower OFF current—an advantage which is particularly relevant in low—and zeropower SRAM applications which feature extended battery operation. In spite of this advantage, however, the bitline to supply (Vcc) leakage of TFTs designed and fabricated in state-of-the-art technology is still too significant to enable battery operation of high-density memory devices, such as SRAMs, over an extended period of time.

The most common approach taken to reduce this bitline to supply leakage has been to reduce the cross-sectional area of the TFT channel, such that the TFT channel is made as thin and as narrow as possible. To this end, technologies which are capable of depositing extremely thin polysilicon layers, having a thickness of approximately 100 Å for instance, have been developed. Unfortunately, the resultant polysilicon grain size of these layers is also very small. Alternately, the width of a TFT of a memory cell may be made much smaller than any other critical dimension (CD) in the circuit. Thus, there are currently available products which feature TFTs having channel widths of 0.3 to 0.4 μm wide while all other CDs are 0.5 μm or larger. As would be anticipated, this difference between the width dimension and other CDs of the memory device places considerable pressure on the photolithography aspect of manufacturing and thus makes manufacturing of a device using such geometries very difficult. Additionally, there are processes which fully enclose the TFT channel by the device gate. This results in process complications which do not render a viable manufacturing approach.

SUMMARY OF THE INVENTION

It would be advantageous in the art to minimize bitline to supply (Vcc) leakage of thin-film transistors (TFTs).

It would further be advantageous in the art to be able to reduce the cross-sectional area of a TFT channel in order to minimize bitline to supply (Vcc) leakage of a thin-film transistor (TFT).

Therefore, according to the present invention, the cross-sectional area of a thin-film transistor (TFT) is decreased in order to minimize bitline to supply leakage of the TFT. This is accomplished by utilizing a spacer etch process to manufacture a TFT having a very narrow and thin channel in a controllable manner. The spacer dimensions of the TFT may be adjusted by simply modifying the thicknesses of the poly gate and the channel poly. The channel thickness is limited by the thickness; of deposited channel polysilicon which may be as thin as approximately 300 Å to 500 Å, and the channel width of the TFT corresponds to the height of the spacer etched along the polysilicon gate of the device which may be as small as approximately 0.15 to 0.25 μm.

A first preferred embodiment of the present invention employs at least two polysilicon layers to effect a spacer etch process which allows the cross-sectional area of a transistor channel of a TFT to be minimized in a controllable manner, thereby reducing the bitline to voltage supply leakage of the TFT. The first preferred embodiment provides planarization as an option. A second preferred embodiment of the present invention also utilizes a spacer etch process by selective etching a poly spacer of a spacer-TFT load structure formed around a first poly gate layer in order to achieve the desired channel length. The second preferred embodiment offers the advantage of requiring just two polysilicon layers; planarization is not required.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1–12 illustrate the cross-sectional views of the processing steps required for manufacturing a TFT structure, according to a first preferred embodiment of the present invention;

FIG. 13 illustrates the mask layout, showing cross-sectional area of a TFT channel, of a conventional TFT structure;

FIG. 14 illustrates the mask layout, showing cross-sectional area of a TFT structure, according to the first preferred embodiment of the present invention;

FIG. 18 illustrates a mask layout of a TFT structure, according to the second preferred embodiment of the present invention.

DESCRIPTION OF THE INVENTION

The present invention utilizes a spacer etch process to make the transistor channel of the TFT both very narrow and thin in a controllable manner. The channel thickness is limited by the thickness of the deposited channel polysilicon which may be as small as approximately 300 to 500 Å, and the channel width corresponds to the height of the spacer etched along the polysilicon gate of the device. The height of the spacer may only be approximately 0.15 to 0.25 μm. These geometries possible with the present invention represent an improvement of more than two times the capabilities of the optical lithographic techniques used to manufacture standard products. The spacer dimensions of the TFT may be adjusted by simply modifying the thickness of the poly gate and the channel poly.

A first preferred embodiment of the present invention produces a TFT device having a channel that is both very narrow and thin, resulting in a small cross sectional area of the TFT channel such that bitline to supply leakage is dramatically reduced. FIGS. 1–14 illustrate the method and structure of the first preferred embodiment of the present invention.

Figure 1:
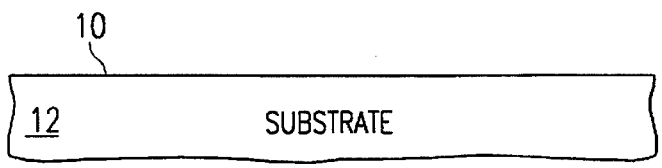
Figure 2:
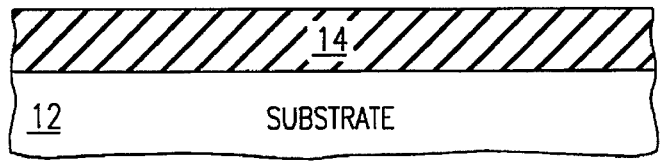
Figure 3:
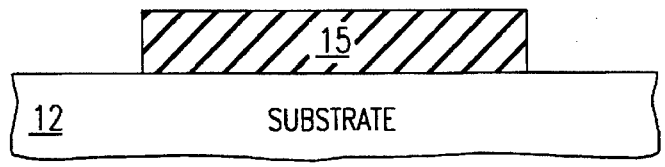

Prior to formation of the TFT, standard layer deposition and etching of contacts for an integrated circuit device well known in the art is performed. These standard process steps typically involve the formation of one or two polysilicon (poly) layers on top of a silicon substrate where the integrated circuit memory device will be formed. Following these standard steps, planarization of the device substrate 12, as shown in the TFT structure 10 of FIG. 1, is performed. Planarization of device substrate 12 shown in FIG. 1 is an optional step. However, planarization may be desirable in order to provide a planar base for the TFT such that the formation of stringers is avoided. TFT poly gate layer 14, having a thickness of approximately 1500 Å to 2500 Å thick, is formed over substrate 12 as shown in FIG. 2. TFT poly gate layer 14 is formed by deposition of a typically conductive material such as polycrystalline or amorphous silicon which may be recrystallized at a later stage. The deposition rate of TFT poly gate layer 14 depends on the temperature at which it is deposited, which may vary from approximately 520° C. to 620° C. depending on the preferred structure of the deposited material. TFT poly gate 14 layer is then subjected to a pattern and etch step, as shown in FIG. 3, to form TFT poly gate 15.

Figure 4:
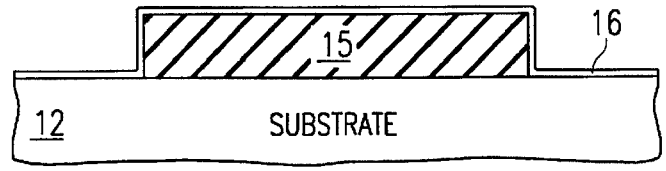
Figure 5:
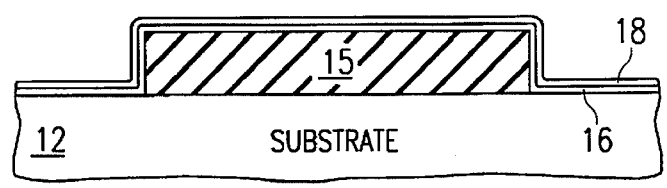

Referring to FIG. 4, deposition of gate oxide layer 16 having a thickness of approximately 100–300 Å is performed on top of TFT poly gate 15 and substrate 12. Gate oxide layer 16 may be Tetra-Ethyl Ortho Silicate (TEOS) or other gate oxide material such as High-Temperature Oxide (HTO). The deposition rate of gate oxide layer 16 is approximately 10 Å/minute to 100 Å/minute. Next, as shown in FIG. 5, a nitride deposition step is performed. Approximately 100–300 Å of nitride; deposited over gate oxide layer 16 at a deposition rate of approximately 10 Å/minute to 100 Å/minute and serves as an overetch protectorate in order to avoid the formation of stringers during subsequent etching steps. This nitride deposition is an optional process step and may not be necessary where the formation of stringers is not a concern.

Figure 6:
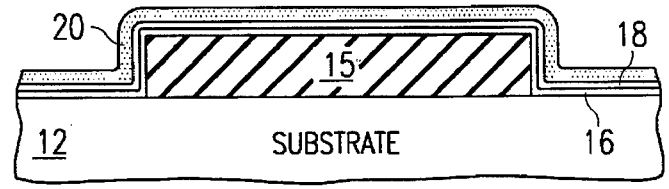
Figure 7:
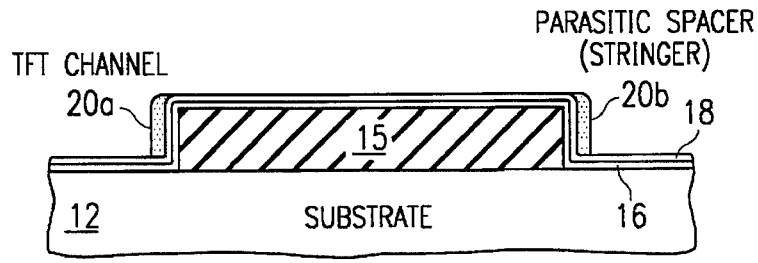

Next, the TFT channel is developed. Referring to FIG. 6, a TFT channel amorphous silicon deposition step is performed. Approximately, 200 Å to 500 Å of TFT channel amorphous silicon 20 is deposited over nitride 18. The deposition of TFT channel amorphous silicon 20 may take place under similar conditions to those specified for the formation of TFT poly gate 14. Deposition of TFT channel amorphous silicon 20 would usually be followed by recrystallization annealing of TFT channel amorphous silicon 20 at approximately 550° C. to 700° C. for approximately 8 hours in order to form a polysilicon layer 20 with adequate grain size. For instance, the typical recrystallization anneal step may occur at 600° C. for 24 hours. If the grain size is not critical, 200 Å to 500 Å of TFT channel polysilicon 20 may be deposited over nitride 18 and the recrystallization annealing step not performed. Referring to FIG. 7, the TFT device 10 is patterned and subjected to an anisotropic etch such that a channel 20a and a second, parasitic spacer, referred to as stringer 20b, are formed adjacent to the side of TFT poly gate 14 as shown. Next, removal of stringers, such as stringer 20b, is accomplished through an additional masking step. This may be followed by adjustment of the TFT VT (threshold voltage) by an appropriate implant or the inherent TFT VT may be used. Thus, if it desirable to adjust the TFT VT (threshold voltage) of the device, implantation with Phosphorous, Arsenic, or BF2 at a dosage of approximately 1-10e12 at an energy of approximately 20–40 keV may be performed. Finally, a source/drain mask and implant are performed to render the memory device 10 of FIG. 8. Additional, standard post-TFT process steps are performed as desired. These additional process steps may include steps calculated to protect or encapsulate the TFT.

Figure 8:
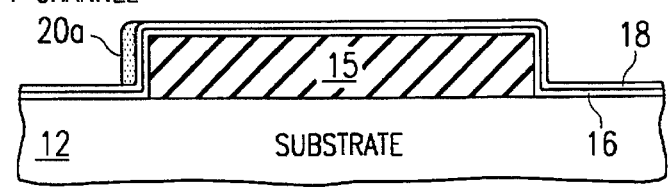

The final TFT structure 10 of FIG. 8 is quite different from the prior art TFT structure, a top view of which is illustrated in FIG. 9. The top view layout of FIG. 9 is typical for TFTs in an SRAM or other integrated circuit memory device. The advantages of the present invention become obvious when the prior art FIG. 9 is contrasted with a top view of the TFT of the present invention shown in FIG. 10. The TFT channel of the present invention of FIG. 10 has a smaller cross-sectional area than the prior art TFT channel of FIG. 9. The TFT channel of the present invention is much narrower and thinner than the TFT channel of the prior art. This smaller cross-sectional area has the effect of reducing the bitline to voltage supply (Vcc) leakage. Very small bitline to voltage supply leakage is important in order to achieve battery operation of integrated circuit memory devices, such as high-density SRAMs, over an extended period of time.

Referring to FIG. 11, mask alignment between the channel poly mask and the poly gate mask which corresponds to the TFT poly gate deposition of FIG. 2 is shown. After the TFT channel poly pattern step, the TFT channel will be etched and spacers, as well as stringers, will be formed along the edge of the TFT gate. As shown in FIG. 12, these unwanted spacers, or stringers, will then be removed using a separate masking step indicated by the dashed lines.

An understanding of the first preferred embodiment of the present invention is further aided by comparing the cross-sectional view of a conventional TFT structure of FIG. 13 with the cross-sectional view of the present invention shown in FIG. 14. The cross-sectional area of the conventional TFT channel is shown as approximately 0.3 to 0.5 μm by approximately 300 to 500 Å, requiring special lithography tools, as mentioned above. The cross-sectional area of the TFT channel of the first embodiment of the present invention is much smaller and is approximately 0.15 to 0.2 μm approximately 300 to 500 Å. This is achieved without any lithography-related constraints.

The process steps and structure of the first preferred embodiment of the present invention, represented in FIGS. 1–14, illustrate a TFT device having a channel that is both very narrow and thin. However, the first preferred embodiment of the present invention requires at least two poly layers: one or two poly layers formed in the standard process steps which are performed prior to the optional planarization of FIG. 1 and the TFT gate poly deposition illustrated in FIG. 2. Referring to FIGS. 15–25, a second preferred embodiment of the present invention which requires just two poly layers and no planarization is shown. The TFT structure 30 of the second preferred embodiment features a poly spacer of a spacer-TFT load structure which is formed around the first poly (gate) layer and selectively etched to provide the necessary channel length. The TFT is formed on top of the field oxide of the structure 30 so that it will not interfere with standard spacer oxide etch and transistor formation in the substrate.

Figure 15:
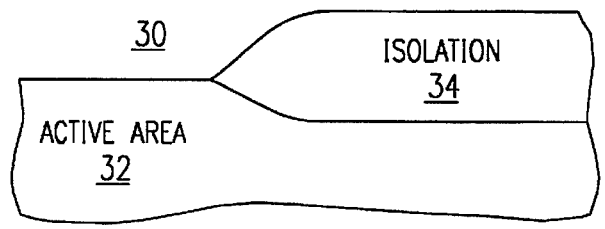
FIGS. 15–24 illustrate the cross-sectional views of the processing steps required for manufacturing a TFT structure, according to a second preferred embodiment of the present invention.
Figure 16:
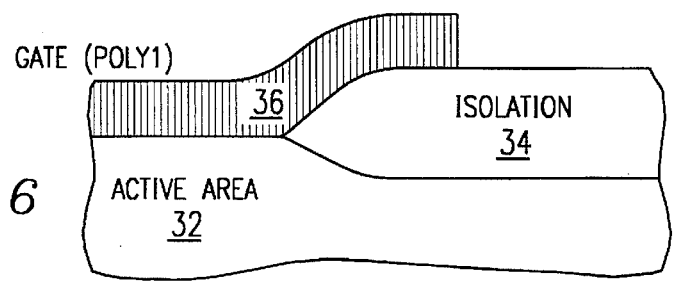

Several standard process steps are first performed before the TFT spacer definition occurs. First, referring to FIG. 15, definition of active region 32 and isolation region 34 adjacent to the active region 23 is accomplished. Active and isolation definition may be followed by an optional buried contact formation well known in the art; a buried contact mask/implant is followed by forming the buried contact opening. Alternately, depending on the layout preference, a shared contact may also be used, in which case a first layer of poly (poly-1) would be deposited directly after the gate oxide growth and pattern. The layout with a shared contact may use slightly more area. Referring to FIG. 16, gate 36 may be formed in a standard way, e.g., by depositing polysilicon at approximately 620° C., at a thickness of approximately 1000 to 2000 Å, then Phosphorous (POCl) deposition and drive-in (e.g. at 900° C. for approximately 30 minutes) or implantation (e.g. P31 at a dosage of approximately 1-10e15 at an energy level of approximately 30–50 keV), followed by an anneal for approximately 30 minutes at approximately 800°–900° C.

To reduce the poly resistance, a polycide layer is usually deposited on top or created by the salicide (self-aligned silicide) process. The gate polycide should be WSi2 (Tungsten Silicide) rather than TaSi2 (Tantalum Silicide) in order to avoid extrusions. The thickness of polycide may be about 1000 to 2000 Å. Polycide or salicide formation would be followed by an etching step. Following the formation of gate poly layer 36 of FIG. 16, gate poly layer 36 and isolation region 34 of structure 30 is subjected to N-/P- implantation using the appropriate masks. N- dopant is e.g., Phosphorous at a dosage of approximately 1-10e13 at an energy level of approximately 25–45 keV, and P- dopant is e.g., BF2, at a dosage of approximately 1-10e13 at an energy level of approximately 30–50 keV, or B11. Only N- implantation will be carried out in the cell area and therefore, the masking steps are not shown in the accompanying figures.

Figure 17:
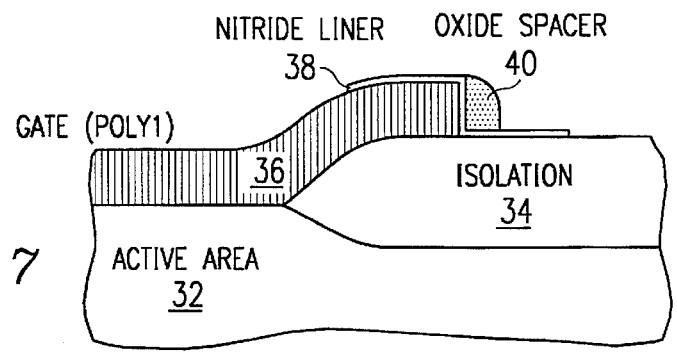
Figure 25:
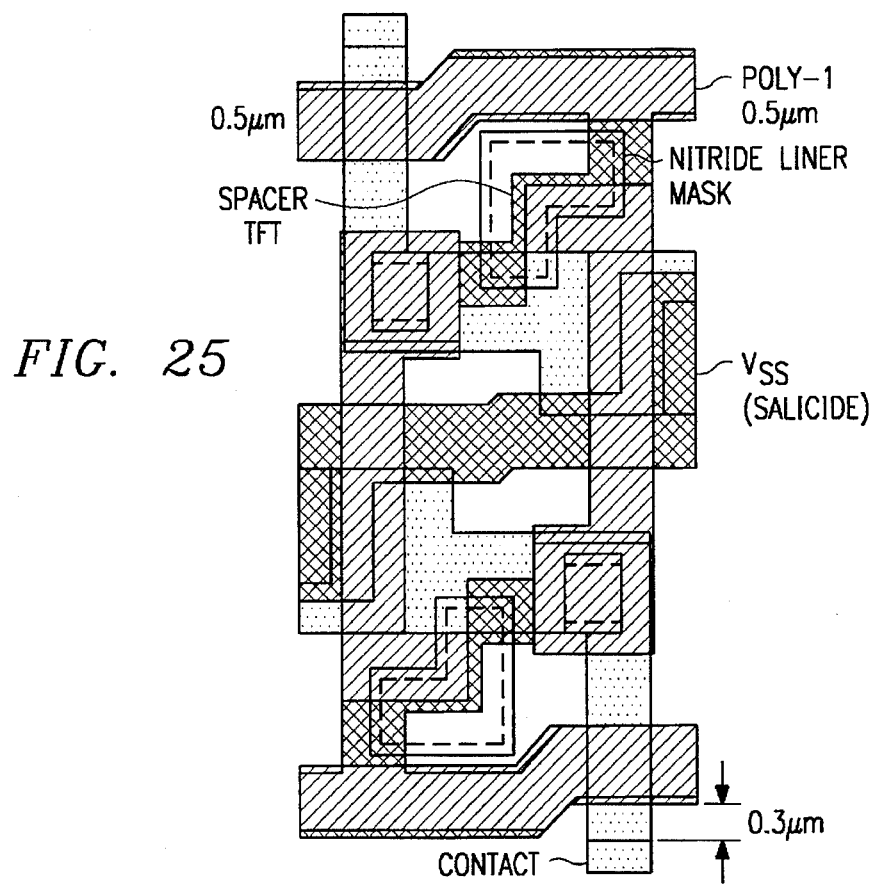
FIG. 25 illustrates a mask layout of a TFT structure, according to the second preferred embodiment of the present invention.

Following the N-/P- implantation, nitride liner 38 is deposited over an end of the gate poly layer 36 and a portion of the isolation region 34 and subsequently patterned. Referring to FIG. 17, Nitride liner 38 is subsequently deposited approximately 100–300 Å thick at a deposition rate of approximately 10–100 Å/minute to protect the underlying field oxide from overetch during the oxide spacer removal. The nitride liner next be patterned if it is unwanted underneath the oxide spacer in the bulk transistor regions created at a later stage. The mask used for this optional patterning is shown in FIG. 25. Depositing Nitride liner 38 is an optional step which provides protection against subsequent oxide spacer overetching. Next, Oxide spacer 40 is formed by depositing a spacer oxide layer followed by etching to form oxide spacer 40 adjacent to the end of gate poly layer 36. Oxide spacer 40 is deposited as a single- or double-layer, depending on the kind of poly-1 gate 36 used: WSi2 or TaSi2, e.g. from TEOS, at approximately 700° C. at a fast deposition rate of approximately 50–250 Å/minute. This is followed by a standard spacer oxide etch to form a spacer.

Figure 18:
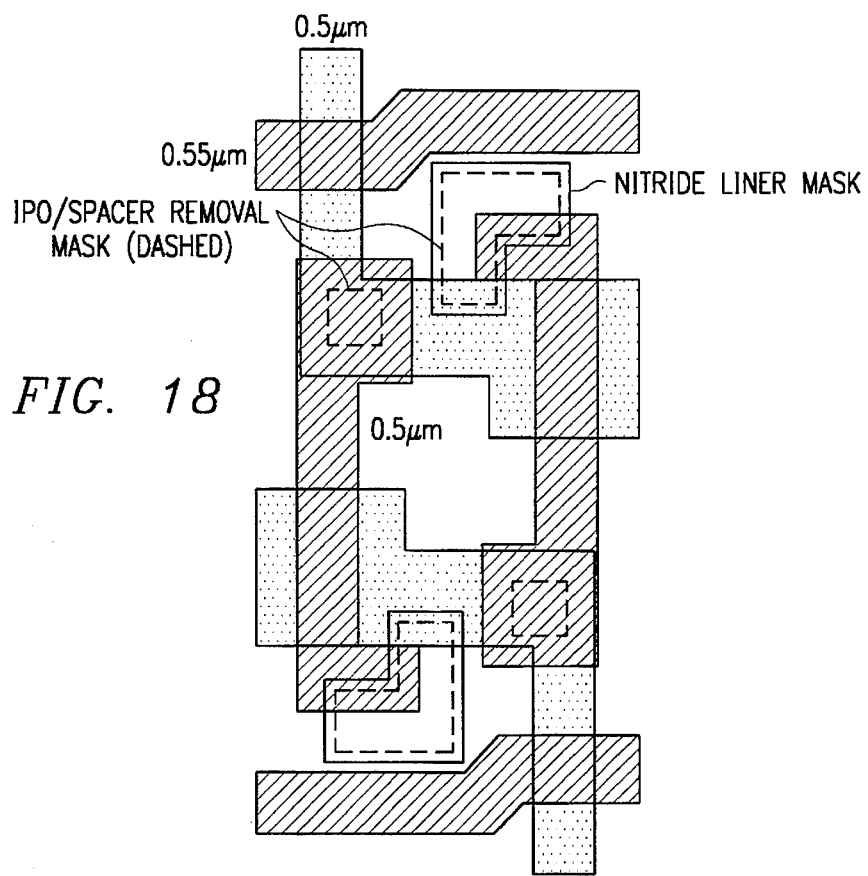

The bulk transistor formation now needs to be completed by N+ and P+ implants using the appropriate masks; again, P+ implantation occurs only in the periphery of the cell area and thus the masks are not shown on the drawings. N+ implant may be Arsenic followed by Phosphorous at dosages of 1-10e15 and 1-10e14, respectively, and energies of approximately 30–50 keV, such as is known in the art, depending on the design rules and the desired final electrical properties of the circuitry. P+ implant is BF2 or Boron at dosages of 1-10e15 and appropriate energies, such as 30 keV, again depending on the desired junction depth/drive current, etc. The mask layers corresponding to the process steps shown and described in conjunction with FIGS. 15–17 are shown in FIG. 18. Both the poly-1 gate layer 36 and the active region 32 are shown.

Figure 19:
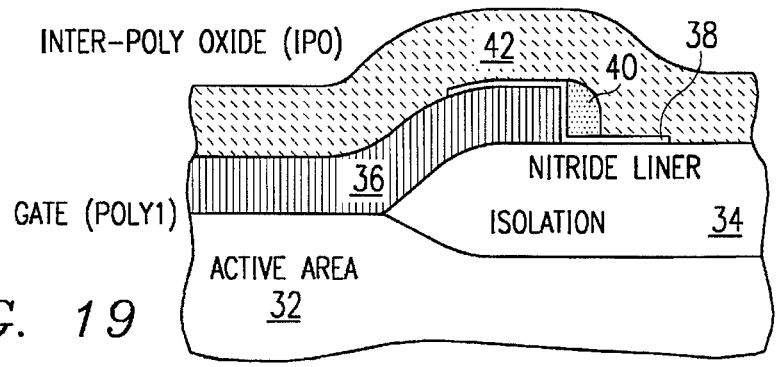

Referring to FIG. 19, to isolate the first-poly gate layer 36 pattern from the overlying second poly layer (especially the word line from voltage supply Vcc), an IPO (Inter-Poly Oxide) layer 42 may be deposited over poly gate layer 36 and the isolation region 34 as shown. This is an optional but recommended process step. Otherwise, the thin TFT gate oxide isolates poly-1 from poly-2; however, such isolation may prove insufficient.

Figure 20:
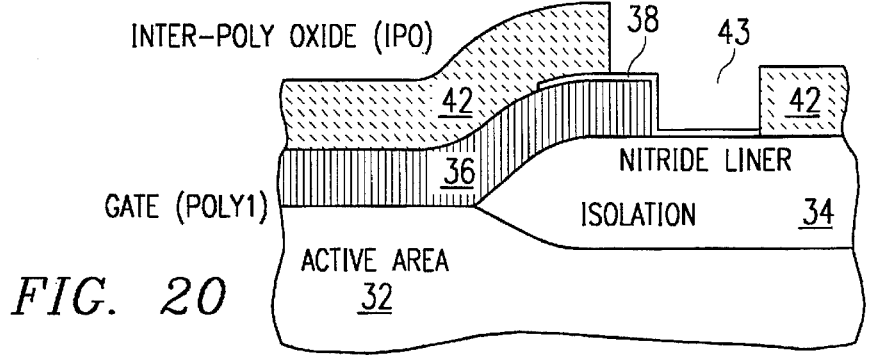

Referring to FIG. 20, the thick IPO oxide layer 42 and the spacer 40 now must be locally removed from the regions where the polysilicon spacer will be formed to act as TFT channel. Thus, a portion of the IPO oxide layer 42 and spacer 42 will be removed to form an opening 43 in IPO oxide layer 42 over isolation region 34 adjacent to the end of poly gate layer 36. A mask for that purpose is shown in FIG. 18. In the field oxide region, the etch would stop at nitride liner 38. There would also be an opening for the shared contact. The nitride liner 38 can now be removed (an optional process step), depending on the desired target thickness of the TFT gate oxide. A dry or wet strip process should easily be sufficient to remove the nitride liner 38, due to the thinness of nitride liner 38.

Figure 21:
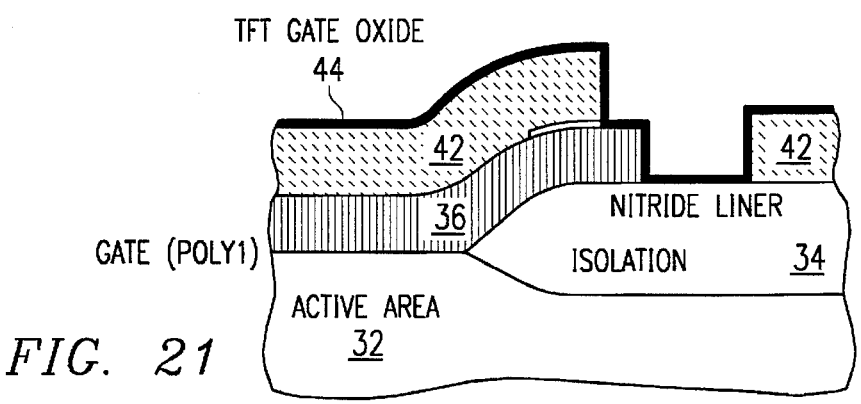
Figure 22:
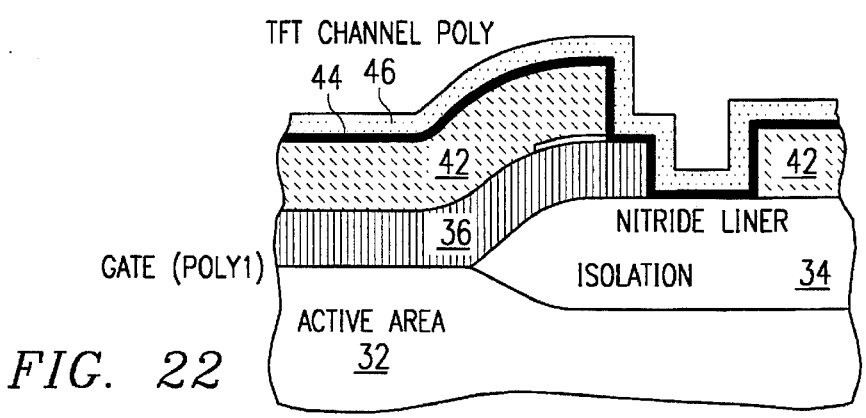
Figure 23:
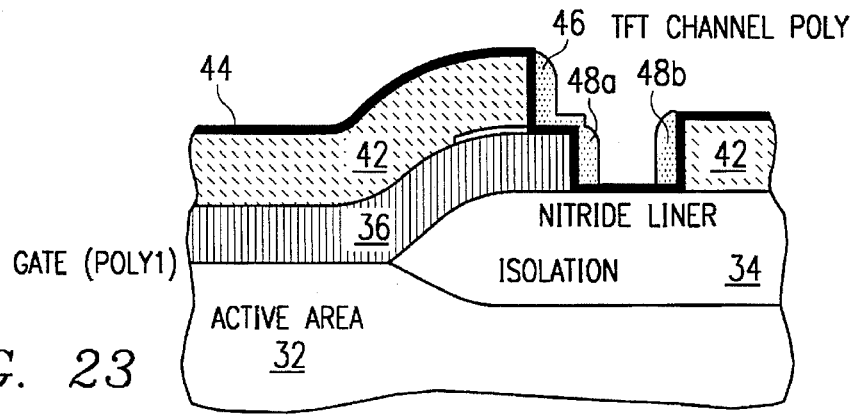
Figure 24:
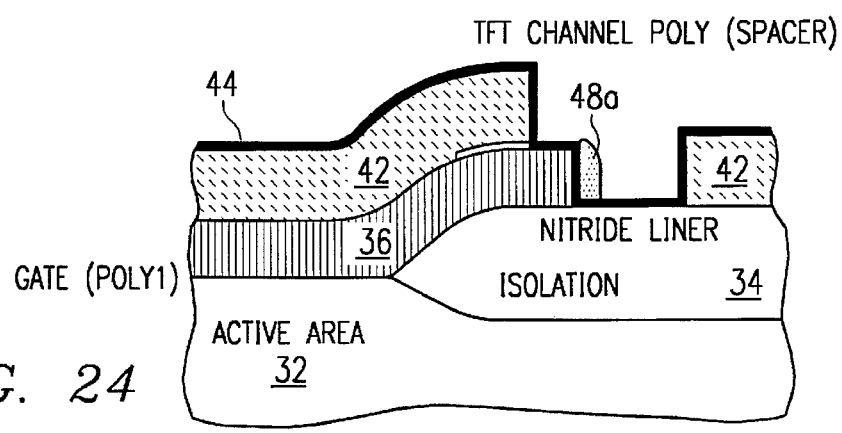

Next, process steps necessary to form a polysilicon spacer for a TFT, according to the second preferred embodiment of the present invention, are performed. Referring to FIG. 21, Oxide is deposited over poly gate 36, IPO oxide layer 42, and opening 43 to form TFT gate oxide layer 44. Next, a shared contact opening is formed as shown in FIG. 22. TFT channel polysilicon layer 46 is deposited over TFT gate oxide layer 44. This is followed by depositing Tantalum (Ta) over TFT channel poly layer 46 in order to decrease series resistance; the Ta, everywhere except on voltage supply lines Vss and Vcc, is subsequently etched away using a mask. A TaSi2 layer may then be formed by RTA (Rapid Thermal Anneal) where Ta has been deposited. The simultaneously salicided Vss and Vcc supply lines allow for reduced series resistance. Finally, TFT channel poly layer 46 is patterned. Referring to FIG. 23, TFT channel poly layer 46 is then etched to create poly spacer 48a and a second, parasitic (unwanted) spacer 48b, referred to as a stringer. Next, as shown in FIG. 24, any stringers are removed through an additional masking step. Thus stringer 48b is removed. This may be followed by a TFT VT (threshold voltage) implant of the device with Phosphorous, Arsenic, or BF2 at a dosage of 1-10e11 and an energy of approximately 30–40 keV, Finally, a source/drain mask and a source/drain implant are performed either at this stage, or earlier, immediately preceding the Ta deposition. Additional, standard post-TFT process steps are performed as desired. These additional process steps may be done to help protect or encapsulate the TFT. For instance, the steps outlined above may be followed by standard planarization processing. The TFT spacer structure 30 of the second preferred embodiment is also illustrated in the top view mask layouts of FIG. 25.

In addition to utilizing only two poly layers rather than three poly layers and not requiring planarization, the second embodiment of the present invention offers other desirable features. The simultaneously salicided Vss and Vcc voltage supply lines of the second preferred embodiment allow for reduced series resistance. Additionally the TFT source (P+) connected to the pull-down gate (N+) through the TaSi or WSi layer ensures that there is no problematic N+/P+ parasitic junction.

While the invention has been particularly shown and described with reference to a preferred embodiment, it will be understood by those skilled in the art that various changes in form and detail may be made therein without departing from the spirit and scope of the invention.

What is claimed is:

1. A thin-film transistor (TFT) structure having a reduced cross-sectional channel area in order to minimize bitline to supply leakage of the TFT, comprising:

a substrate;

a TFT polysilicon gate formed on top of the substrate;

a gate oxide layer formed over the substrate and the TFT polysilicon gate;

a TFT polysilicon channel formed adjacent to a side of the TFT polysilicon gate, wherein the TFT polysilicon channel has a channel thickness which is limited by the thickness of a deposited channel polysilicon layer which has been selectively removed leaving only the TFT polysilicon channel and wherein the TFT polysilicon channel has a channel width that corresponds to the height of the TFT polysilicon channel etched along the TFT polysilicon gate.

2. The structure of claim 1, wherein the channel thickness is approximately 300 to 500 Å and the channel width is approximately 0.15 to 0.25 μm.

3. The structure of claim 1, wherein the channel thickness and the channel width of the TFT polysilicon channel are adjusted by modifying the thickness of the TFT polysilicon gate.

4. A thin-film transistor (TFT) structure having a reduced cross-sectional channel area in order to minimize bitline to supply leakage of the TFT, comprising:

an isolation region adjacent to an active region;

a polysilicon gate region formed over the active region and a first portion of the isolation region, wherein the active region is adjacent to the first portion of the isolation region;

a first oxide layer formed over a first portion of the active region and over a second portion of the isolation region;

an opening formed in the first oxide layer over a third portion of the isolation region adjacent to an end of the polysilicon gate region;

a second oxide layer formed over the first oxide layer, the polysilicon gate region, and the opening formed in the first oxide layer; and a TFT polysilicon channel formed in the opening of the first oxide layer adjacent to the end of the polysilicon gate region, wherein the TFT polysilicon channel has a channel thickness which is limited by the thickness of a deposited channel polysilicon layer which has been selectively removed.

5. The structure of claim 4, wherein the channel thickness is approximately 300 to 500 Å and a channel width of the TFT polysilicon channel is approximately 0.15 to 0.25 μm.

6. The structure of claim 4, wherein the channel thickness and the channel width of the TFT polysilicon channel are adjusted by modifying the thickness of the polysilicon gate region.

* * * * *